(12) United States Patent
Lee et al.

(10) Patent No.: US 10,283,652 B1
(45) Date of Patent: May 7, 2019

(54) ELECTRODE STACK STRUCTURE CAPABLE OF PREVENTING MOISTURE FROM ENTERING PHOTODIODE

(71) Applicant: LuxNet Corporation, Zhongli, Taoyuan County (TW)

(72) Inventors: Kuo-Hao Lee, Zhongli (TW);
Tsung-Chi Hsu, Zhongli (TW);
Ming-Chih Lai, Zhongli (TW)

(73) Assignee: LUXNET CORPORATION, Zhongli (TW)

( * ) Notice: Subject to any disclaimer, the term of this patent is extended or adjusted under 35 U.S.C. 154(b) by 0 days.

(21) Appl. No.: 16/012,252

(22) Filed: Jun. 19, 2018

(30) Foreign Application Priority Data

Feb. 2, 2018 (TW) .............................. 107201632 U

(51) Int. Cl.
| H01L 31/02 | (2006.01) |
| H01L 31/0203 | (2014.01) |
| H01L 31/0216 | (2014.01) |
| H01L 27/12 | (2006.01) |
| H01L 31/0224 | (2006.01) |

(52) U.S. Cl.
CPC .......... *H01L 31/0203* (2013.01); *H01L 27/12* (2013.01); *H01L 31/02005* (2013.01); *H01L 31/02161* (2013.01); *H01L 31/022408* (2013.01)

(58) Field of Classification Search
CPC .................. H01L 31/0205; H01L 31/0203

USPC .......................................... 257/292, 431, 437
See application file for complete search history.

(56) References Cited

U.S. PATENT DOCUMENTS

| 2015/0123231 A1* | 5/2015 | Chien .................. H01L 23/481 |
| | | 257/432 |
| 2017/0005120 A1* | 1/2017 | Wasaki ............... H01L 27/1462 |
| 2018/0062004 A1* | 3/2018 | Ru ........................... C09D 1/00 |

* cited by examiner

Primary Examiner — David Vu
Assistant Examiner — Brandon C Fox
(74) Attorney, Agent, or Firm — WPAT, PC

(57) ABSTRACT

The present invention provides an electrode stack structure capable of preventing moisture from entering a photodiode, comprising: a semiconductor layer; an inner electrode layer provided on the semiconductor layer; a dielectric layer coating a sidewall of the semiconductor layer; an intermediate metal layer provided on, bonded to, and in electrical conduction with the inner electrode layer, wherein the intermediate metal layer has a bottom side extending over and covering a portion of the dielectric layer to provide airtightness; and an anti-reflection layer coating on an outer side of the semiconductor layer, an outer side of the intermediate metal layer, and an outer side of the dielectric layer, with a groove formed in the anti-reflection layer by leaving a predetermined area of a top side of the intermediate metal layer uncoated or by removing a portion of the anti-reflection layer that coats the predetermined area of the top side of the intermediate metal layer, and an outer electrode layer plated on the predetermined area of the top side of the intermediate metal layer.

8 Claims, 6 Drawing Sheets

ELECTRODE STACK STRUCTURE CAPABLE OF PREVENTING MOISTURE FROM ENTERING PHOTODIODE

BACKGROUND OF THE INVENTION

1. Technical Field

The present invention relates to an electrode stack structure for a photodiode. More particularly, the invention relates to an electrode stack structure for use in a photodiode and configured to ward off moisture effectively.

2. Description of Related Art

A photodiode is a photodetector designed to convert light into current or voltage signals. The typical structure of a photodiode is a p-n junction or p-i-n structure so that a light beam striking the diode can excite the diode and generate free electrons (along with positively charged holes) in the diode. The mechanism is also known as the internal photoelectric effect. If absorption of the light beam takes place in the depletion layer, or depletion region, the internal electric field of the region will eliminate barriers in the region, allowing the holes to move toward the anode and the electrons toward the cathode to complete photoelectric conversion.

Referring to FIG. 1, a conventional photodiode is generally made by coating the sidewall of the semiconductor layer N1 with a dielectric layer N2 for insulation and passivation, then coating the top and peripheral sides of the assembly with an anti-reflection layer N4 to reduce the loss of light, removing a portion of the anti-reflection layer N4 that is adjacent to the electrode N3, and last but not least, plating the exposed portion of the electrode N3 and the adjacent portion of the anti-reflection layer N4 with a metal layer N5 to enable electrical conduction. However, the dielectric layer N2 does not bond well to the anti-reflection layer N4, particularly in areas where these two layers are applied to uneven surfaces and are therefore irregular in thickness. This is especially true in the vicinity of the electrode conduction region, which is generally at the highest position of the photodiode and hence corresponds to the thinnest portion of the dielectric layer N2. If the photodiode is used in a high-temperature and high-humidity environment, moisture is very likely to enter the photodiode through the poorly bonded areas, causing damage to the photodiode.

BRIEF SUMMARY OF THE INVENTION

The primary objective of the present invention is to provide structural improvement, and consequently airtightness, to the portions of a conventional photodiode that are adjacent to the electrodes, lest the photodiode be damaged by moisture seeping through gaps resulting from the dielectric layer.

To achieve the foresaid objective, the present invention provides an electrode stack structure capable of preventing moisture from entering a photodiode, comprising: a semiconductor layer; an inner electrode layer provided on the semiconductor layer; a dielectric layer coating a sidewall of the semiconductor layer; an intermediate metal layer provided on, bonded to, and in electrical conduction with the inner electrode layer, wherein the intermediate metal layer has a bottom side extending over and covering a portion of the dielectric layer to provide airtightness; and an anti-reflection layer coating on an outer side of the semiconductor layer, an outer side of the intermediate metal layer, and an outer side of the dielectric layer, with a groove formed in the anti-reflection layer by leaving a predetermined area of a top side of the intermediate metal layer uncoated or by removing a portion of the anti-reflection layer that coats the predetermined area of the top side of the intermediate metal layer, and an outer electrode layer plated on the predetermined area of the top side of the intermediate metal layer.

Further, the intermediate metal layer is bonded to the dielectric layer and the inner electrode layer through vapor deposition.

Further, the intermediate metal layer includes a metal substrate and two thin metal layers that are bonded respectively to the top and bottom sides of the metal substrate and bond well to the anti-reflection layer and the dielectric layer respectively.

Further, the metal substrate is gold (Au).

Further, the thin metal layers bonded to the top and bottom sides of the metal substrate are titanium (Ti), chromium (Cr), or nickel (Ni).

Further, the dielectric layer is benzocyclobutene (BCB) or polyimide (PI).

Further, the anti-reflection layer is a silicon nitride (SiNx), silicon dioxide (SiO2), or aluminum oxide (Al2O3).

Therefore, the present invention has the following beneficial effects compared with the prior art:

1. The electrode stack structure of the present invention can keep off moisture effectively. A photodiode using the electrode stack structure is protected from damage associated with the ingress of moisture through gaps formed because of the dielectric layer.

2. The intermediate metal layer in the present invention helps maintain or even increase the area of the electrode, in order for the impedance of the electrode to stay at an appropriate level.

3. The intermediate metal layer in the present invention can cover any gap between the dielectric layer and the inner electrode layer and thus ensure airtightness even if the dielectric layer is shifted in position while being formed by photolithography. As a result, the alignment of photomasks is made easy.

DETAILED DESCRIPTION OF THE INVENTION

The details and technical solution of the present invention are hereunder described with reference to accompanying drawings. For illustrative sake, the accompanying drawings are not drawn to scale. The accompanying drawings and the scale thereof are not restrictive of the present invention.

Figure 1:
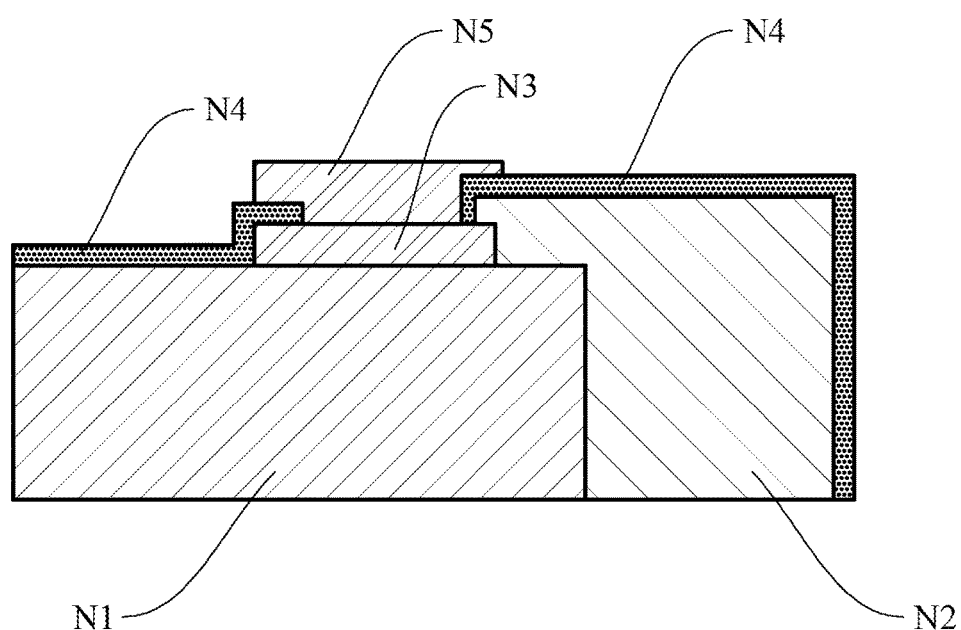
FIG. 1 shows a partial sectional view of an electrode of a photodiode of a prior art.
Figure 2:
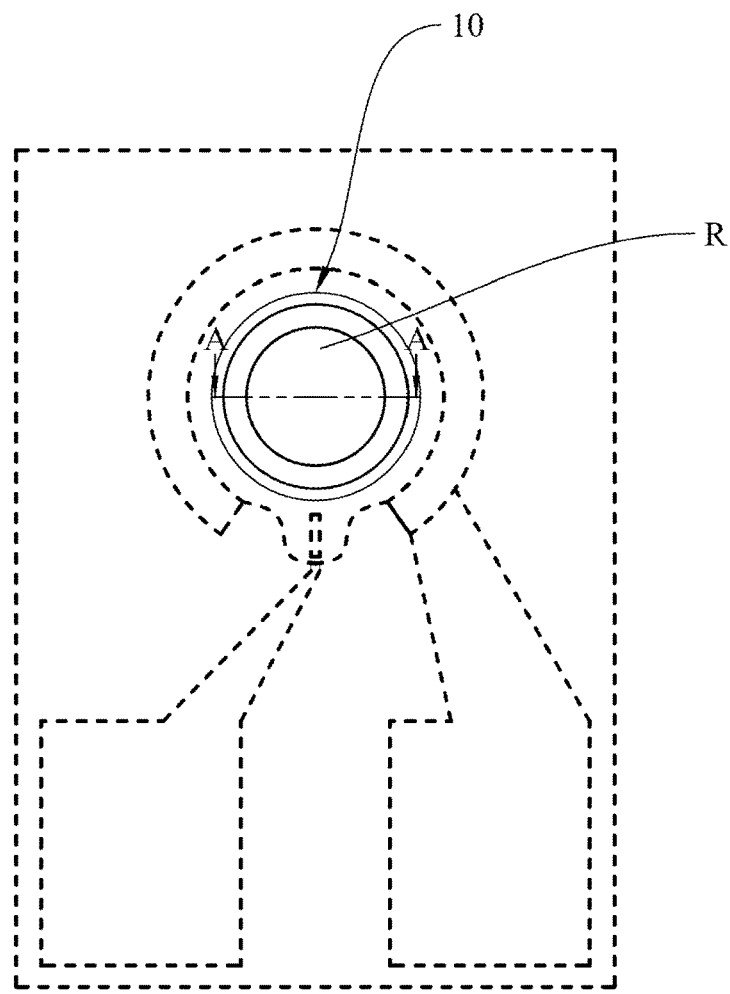
FIG. 2 shows a top view of the first embodiment of the present invention.

Please refer to FIG. 2 for a top view of the first embodiment of the present invention.

FIG. 2 shows an external schematic view of a photodiode 100. The electrode stack structure 10 of the present invention is located at the top side of the photodiode 100. The electrode at the top side of the photodiode 100 includes a light-receiving area R at the center. The light-receiving area R is used to receive a light beam so that the light beam can excite a semiconductor layer and thereby produce the photoelectric effect, converting optical signals to electrical ones.

Figure 3:
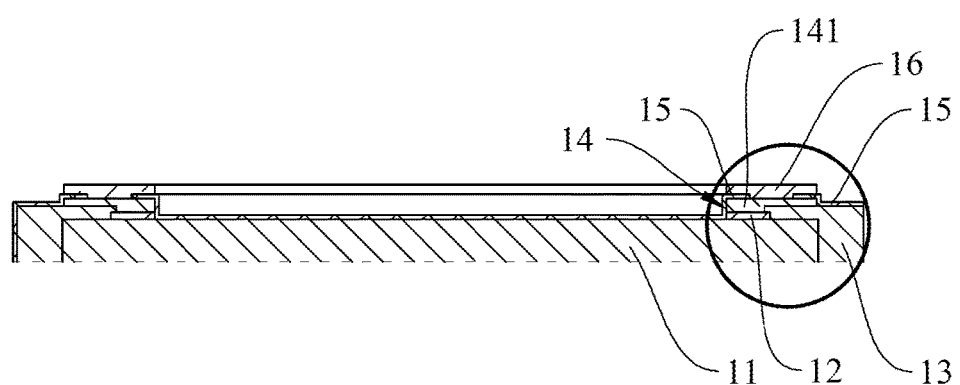
FIG. 3 shows a partial sectional view of the first embodiment of the present invention.
Figure 4:
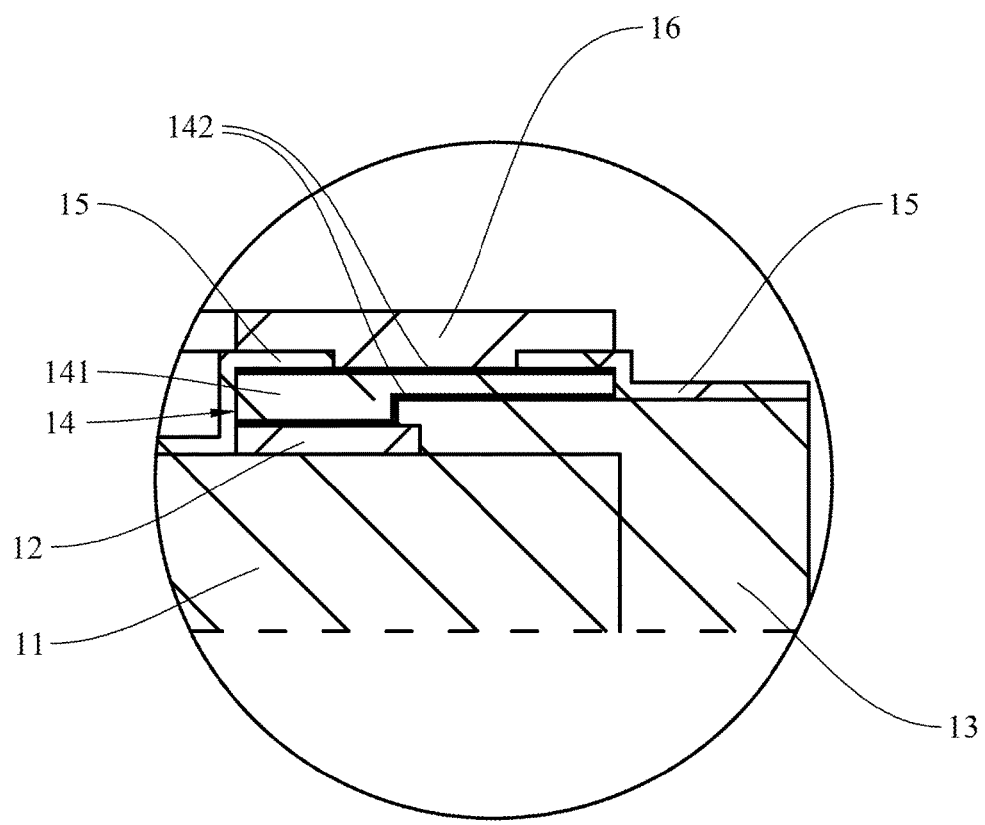
FIG. 4 shows a partial enlarged sectional view of the first embodiment of the present invention.

The electrode stack structure is detailed below with reference to FIG. 3 and FIG. 4, which are respectively a partial sectional view and a partial enlarged sectional view of the first embodiment of the present invention.

In this embodiment, the electrode stack structure 10 of the photodiode 100 essentially includes a semiconductor layer 11, an inner electrode layer 12, a dielectric layer 13, an intermediate metal layer 14, an anti-reflection layer 15, and an outer electrode layer 16.

The semiconductor layer 11 is provided at a relatively low position in the electrode stack structure. In this embodiment, the interface as light-receiving of the semiconductor layer 11 is generally a p-type semiconductor, and the junction between the bottom side of the p-type semiconductor and the n-type semiconductor forms a depletion region. In another preferred embodiment, an intrinsic semiconductor layer is additionally provided between the p-type semiconductor and the n-type semiconductor to prevent the generation of parasitic capacitance and thereby increase the response velocity of the photodiode.

The inner electrode layer 12 is provided on the semiconductor layer 11 as an electrode pad for the p-type semiconductor. To protect the semiconductor layer 11, the sidewall of the semiconductor layer 11 is coated with the dielectric layer 13 during the manufacturing process. More specifically, the dielectric layer 13 is formed by a photolithography-based pattern transfer process to provide insulation and passivation, thereby keeping the semiconductor layer from exposure to the surroundings. In a preferred embodiment, the dielectric layer 13 is benzocyclobutene (BCB) or polyimide (PI).

In this embodiment, the inner electrode layer 12 lies on the top side of the semiconductor layer 11 and is fairly close to the periphery of the electrode stack structure 10. To ensure that the semiconductor layer 11 is completely covered, it is common practice to cover certain surface portions of the inner electrode layer 12 with the dielectric layer 13 while forming the dielectric layer 13. It should be pointed out that the portion of the dielectric layer 13 that is adjacent to the inner electrode layer 12 is quite close to the top side of the photodiode 100 and is therefore relatively thin. So, to prevent moisture from entering the photodiode 100 through areas where the dielectric layer 13 is relatively thin, the present invention additionally provides the intermediate metal layer 14 on the inner electrode layer 12. The intermediate metal layer 14 is provided on, bonded to, and in electrical conduction with the inner electrode layer 12. Also, the bottom side of the intermediate metal layer 14 extends over and covers a portion of the dielectric layer 13 to provide airtightness. In a preferred embodiment, the intermediate metal layer 14 is bonded to the dielectric layer 13 and the inner electrode layer 12 through vapor deposition.

The anti-reflection layer 15 coats the outer side of the semiconductor layer 11, of the intermediate metal layer 14, and of the dielectric layer 13, except for predetermined areas of the top side of the intermediate metal layer 14, wherein the predetermined areas are left uncoated in order to form grooves in the anti-reflection layer 15. Alternatively, the top side of the intermediate metal layer 14 is completely coated with the anti-reflection layer 15, and then the portions of the anti-reflection layer 15 that respectively coat the predetermined areas of the top side of the intermediate metal layer 14 are removed to form grooves the anti-reflection layer 15. In either case, the uncoated predetermined areas of the top side of the intermediate metal layer 14 and the adjacent portions of the anti-reflection layer 15 will subsequently be plated with the outer electrode layer 16. In a preferred embodiment, the anti-reflection layer 15 is a silicon nitride ($SiN_x$), silicon dioxide ($SiO_2$), or aluminum oxide ($Al_2O_3$).

To enhance the intended airtightness, the intermediate metal layer 14 includes a metal substrate 141 and two thin metal layers 142 that are bonded respectively to the top and bottom sides of the metal substrate 141 and bond well to the anti-reflection layer 15 and the dielectric layer 13 respectively. With each thin metal layer 142 capable of bonding satisfactorily to the anti-reflection layer 15 or the dielectric layer 13, the anti-reflection layer 15 and the dielectric layer 13 will bond tightly to the corresponding thin metal layers 142 respectively to hinder the ingress of moisture. In particular, the intermediate metal layer 14 may be gold (Au), which is highly conductive, or other similar materials; the present invention has no limitation in this regard. The thin metal layers 142 bonded to the metal substrate 141 may be titanium (Ti), chromium (Cr), nickel (Ni), or other materials that bond well to resin or semiconductor materials; the present invention has no limitation in this regard, either.

Figure 5:
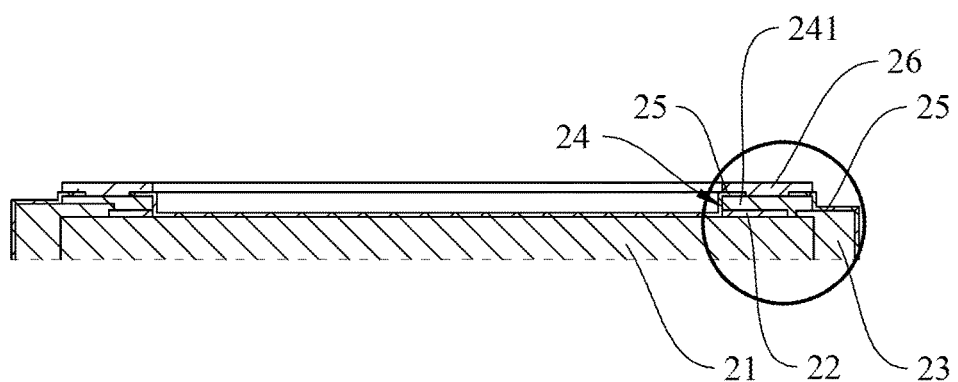
FIG. 5 shows a partial sectional view of the second embodiment of the present invention.
Figure 6:
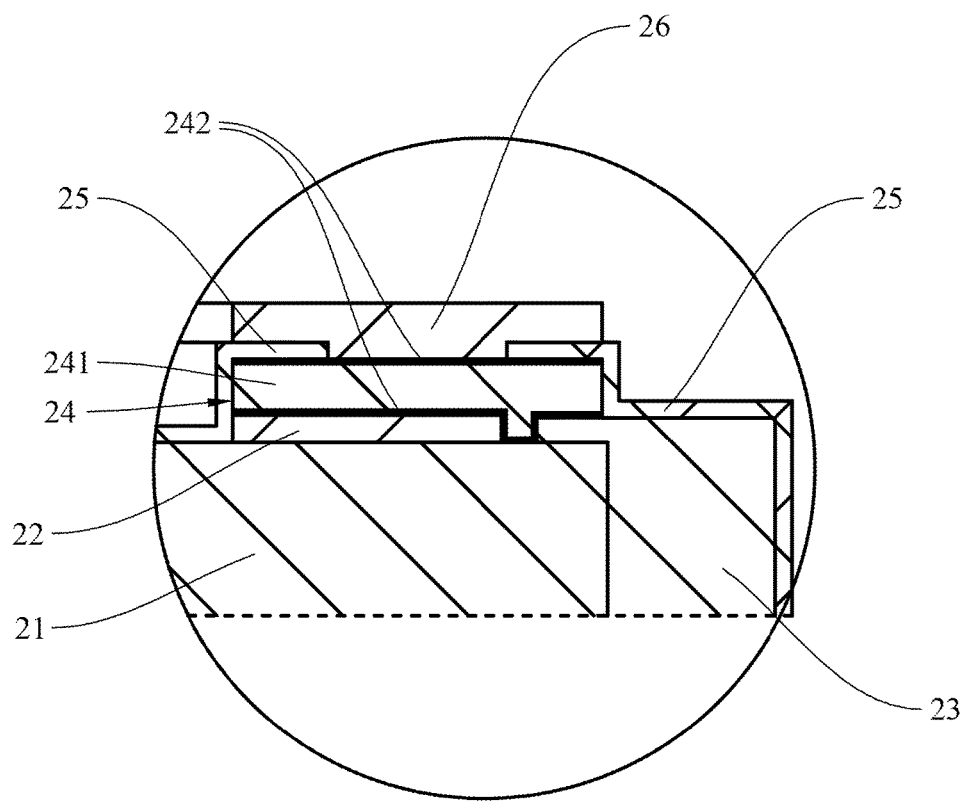
FIG. 6 shows a partial enlarged sectional view of the second embodiment of the present invention.

Another preferred embodiment of the present invention is described below with reference to FIG. 5 and FIG. 6, which are respectively a partial sectional view and a partial enlarged sectional view of the second embodiment of the invention.

In this embodiment, the electrode stack structure 20 for use in a photodiode essentially includes a semiconductor layer 21, an inner electrode layer 22, a dielectric layer 23, an intermediate metal layer 24, an anti-reflection layer 25, and an outer electrode layer 26.

The semiconductor layer 21 is provided at a relatively low position in the electrode stack structure 20. In this embodiment, the light-receiving interface of the semiconductor layer 21 is generally a p-type semiconductor, and the junction between the bottom side of the p-type semiconductor and the n-type semiconductor forms a depletion region. In another preferred embodiment, an intrinsic semiconductor layer is additionally provided between the p-type semiconductor and the n-type semiconductor to prevent the generation of parasitic capacitance and thereby increase the response velocity of the photodiode.

The inner electrode layer 22 is provided on the semiconductor layer 21 as an electrode pad of the p-type semiconductor. To protect the semiconductor layer 21, the sidewall of the semiconductor layer 21 is coated with the dielectric layer 23 during the manufacturing process in order to provide insulation and passivation, keeping the semiconductor layer 21 from exposure to the surroundings. In a preferred embodiment, the dielectric layer 23 is benzocyclobutene (BCB) or polyimide (PI).

In this embodiment, the inner electrode layer 22 lies on the top side of the semiconductor layer 21 and is closer to the center of the electrode stack structure than its counterpart in the first embodiment. While forming the dielectric layer 23, therefore, a gap may be reserved between the dielectric layer 23 and the inner electrode layer 22. The intermediate metal layer 24 is provided on, bonded to, and in electrical conduction with the inner electrode layer 22. In addition, the bottom side of the intermediate metal layer 24 not only extends over and covers a portion of the dielectric layer 23, but also extends into and covers the gap between the dielectric layer 23 and the inner electrode layer 22 to provide airtightness. In a preferred embodiment, the intermediate metal layer 24 is bonded to the dielectric layer 23 and the inner electrode layer 22 through vapor deposition.

The anti-reflection layer 25 coats the outer side of the semiconductor layer 21, of the intermediate metal layer 24, and of the dielectric layer 23, except for predetermined areas of the top side of the intermediate metal layer 24, wherein the predetermined areas are left uncoated in order to form grooves in the anti-reflection layer 25. Alternatively, the top side of the intermediate metal layer 24 is completely coated with the anti-reflection layer 25, and then the portions of the anti-reflection layer 25 that respectively coat the predetermined areas of the top side of the intermediate metal layer 24 are removed to form grooves in the anti-reflection layer 25. In either case, the uncoated predetermined areas of the top side of the intermediate metal layer 24 and the adjacent portions of the anti-reflection layer 25 will subsequently be plated with the outer electrode layer 26. In a preferred embodiment, the anti-reflection layer 25 is a silicon nitride ($SiN_x$), silicon dioxide ($SiO_2$), or aluminum oxide ($Al_2O_3$).

To enhance the intended airtightness, the intermediate metal layer 24 includes a metal substrate 241 and two thin metal layers 242 that are bonded respectively to the top and bottom sides of the metal substrate 241 and bond well to the anti-reflection layer 25 and the dielectric layer 23 respectively. With each thin metal layer 242 capable of bonding satisfactorily to the anti-reflection layer 25 or the dielectric layer 23, the anti-reflection layer 25 and the dielectric layer 23 will bond tightly to the corresponding thin metal layers 242 respectively to hinder the ingress of moisture. In particular, the intermediate metal layer 24 may be gold (Au), which is highly conductive, or other similar materials; the present invention has no limitation in this regard. The thin metal layers 242 bonded to the metal substrate 241 may be titanium (Ti), chromium (Cr), nickel (Ni), or other materials that bond well to resin or semiconductor materials; the present invention has no limitation in this regard, either.

As above, the electrode stack structure of the present invention can keep off moisture effectively. A photodiode using the electrode stack structure is protected from damage associated with the ingress of moisture through gaps formed because of the dielectric layer. The intermediate metal layer in the present invention helps maintain or even increase the area of the electrode, in order for the impedance of the electrode to stay at an appropriate level. Besides, the intermediate metal layer in the present invention can cover any gap between the dielectric layer and the inner electrode layer and thus ensure airtightness even if the dielectric layer is shifted in position while being formed by photolithography. As a result, the alignment of photomasks is made easy.

While the present invention has been described in connection with certain exemplary embodiments, it is to be understood that the invention is not limited to the disclosed embodiments, but, on the contrary, intended to cover various modifications and equivalent arrangements included within the spirit and scope of the appended claims and equivalents thereof.

What is claimed is:

1. An electrode stack structure capable of preventing moisture from entering a photodiode, comprising:
   a semiconductor layer;
   an inner electrode layer provided on the semiconductor layer;
   a dielectric layer coating a sidewall of the semiconductor layer;
   an intermediate metal layer provided on, bonded to, and in electrical conduction with the inner electrode layer, wherein the intermediate metal layer has a bottom side extending over and covering a portion of the dielectric layer to provide airtightness; and
   an anti-reflection layer coating on an outer side of the semiconductor layer, an outer side of the intermediate metal layer, and an outer side of the dielectric layer, with a groove formed in the anti-reflection layer by leaving a predetermined area of a top side of the intermediate metal layer uncoated or by removing a portion of the anti-reflection layer that coats the predetermined area of the top side of the intermediate metal layer, and an outer electrode layer plated on the predetermined area of the top side of the intermediate metal layer.

2. The electrode stack structure capable of preventing moisture from entering a photodiode of claim 1, wherein the intermediate metal layer is bonded to the dielectric layer and the inner electrode layer through vapor deposition.

3. The electrode stack structure capable of preventing moisture from entering a photodiode of claim 1, wherein the intermediate metal layer includes a metal substrate and two thin metal layers that are bonded respectively to the top and bottom sides of the metal substrate and bond well to the anti-reflection layer and the dielectric layer respectively.

4. The electrode stack structure capable of preventing moisture from entering a photodiode of claim 3, wherein the metal substrate is gold (Au).

5. The electrode stack structure capable of preventing moisture from entering a photodiode of claim 3, wherein the thin metal layers bonded to the top and bottom sides of the metal substrate are titanium (Ti), chromium (Cr), or nickel (Ni).

6. The electrode stack structure capable of preventing moisture from entering a photodiode of claim 4 wherein the thin metal layers bonded to the top and bottom sides of the metal substrate are titanium (Ti), chromium (Cr), or nickel (Ni).

7. The electrode stack structure capable of preventing moisture from entering a photodiode of claim 1, wherein the dielectric layer is benzocyclobutene (BCB) or polyimide (PI).

8. The electrode stack structure capable of preventing moisture from entering a photodiode of claim 1, wherein the anti-reflection layer is a silicon nitride ($SiN_x$), silicon dioxide ($SiO_2$), or aluminum oxide ($Al_2O_3$).

* * * * *